United States Patent
Brophy et al.

(10) Patent No.: US 6,735,008 B2
(45) Date of Patent: May 11, 2004

(54) MEMS MIRROR AND METHOD OF FABRICATION

(75) Inventors: Christopher P. Brophy, Corning, NY (US); Xiaodong R. Fu, Painted Post, NY (US); David W. Lambert, Corning, NY (US); Paul P. Merchant, deceased, late of Corning, NY (US), by Gail F. O'Neill-Merchant, executrix

(73) Assignee: Corning Incorporated, Corning, NY (US)

(*) Notice: Subject to any disclaimer, the term of this patent is extended or adjusted under 35 U.S.C. 154(b) by 7 days.

(21) Appl. No.: 09/919,325

(22) Filed: Jul. 31, 2001

(65) Prior Publication Data

US 2002/0075554 A1 Jun. 20, 2002

Related U.S. Application Data

(60) Provisional application No. 60/221,940, filed on Jul. 31, 2000.

(51) Int. Cl.[7] .............................................. G02B 26/00
(52) U.S. Cl. ...................... 359/245; 359/248; 359/254; 359/290
(58) Field of Search .................. 359/290, 291, 359/245, 247, 248, 254, 214, 221, 224–226, 230, 846; 438/53, 52; 248/476; 310/328

(56) References Cited

U.S. PATENT DOCUMENTS

| | | | | |
|---|---|---|---|---|
| 4,710,732 A | * | 12/1987 | Hornbeck | 359/291 |
| 5,159,225 A | * | 10/1992 | Um | 310/328 |
| 5,212,582 A | * | 5/1993 | Nelson | 359/224 |
| 5,469,302 A | * | 11/1995 | Lim | 359/846 |
| 5,506,720 A | * | 4/1996 | Yoon | 359/224 |
| 5,696,618 A | * | 12/1997 | Ji et al. | 359/224 |
| 5,719,073 A | * | 2/1998 | Shaw et al. | 438/53 |
| 5,846,849 A | * | 12/1998 | Shaw et al. | 438/52 |
| 6,025,951 A | * | 2/2000 | Swart et al. | 359/245 |
| 6,059,250 A | * | 5/2000 | Reuter et al. | 248/476 |
| 6,198,180 B1 | * | 3/2001 | Garcia | 310/36 |
| 2002/0067534 A1 | * | 6/2002 | Holl et al. | 359/290 |

* cited by examiner

*Primary Examiner*—Huy Mai
(74) *Attorney, Agent, or Firm*—Joanne N. Pappas

(57) ABSTRACT

A moveable micromirror includes a supporting structure, a flexible post extending from the supporting structure, and a table extending radially from the end of the post along a plane generally perpendicular to the post, the table having a reflective surface facing away from the supporting structure. The post, preferably formed of single-crystal silicon, is dimensioned to be sufficiently flexible to allow the reflective surface to be selectively moveable and positionable, with at least two degrees of freedom, when urged by a suitable actuating force. A method of making an array of moveable micromirrors of this type includes deep etching a silicon substrate so as to form posts surrounded by trenches, etching back the surface of the substrate around the posts so as to allow the posts to protrude beyond the surface of the substrate, and affixing a table with a reflective surface thereon to the tops of a plurality of the posts.

23 Claims, 8 Drawing Sheets

MEMS MIRROR AND METHOD OF FABRICATION

This application claims the benefit of U.S. Provisional Patent Application No. 60/221,940, filed, Jul. 31, 2000.

BACKGROUND OF THE INVENTION

1. Field of the Invention

The present invention relates generally to micro-mirrors of the type typically known as micro-electro-mechanical systems (MEMS) mirrors, and particularly to MEMS mirrors useful for controllably directing optical beams within an optical switch.

2. Technical Background

An emerging optical switching technology employs MEMS mirrors, moveable in at least two degrees of freedom, to steer optical beams within an optical switch. Within the switch, an incoming signal formed into an optical beam propagates to a first moveable mirror. By controllably positioning the first moveable mirror, the beam is directed to a selected second moveable mirror. The second moveable mirror is also controllably positioned, so as to receive the beam from the first mirror and reflect it to an optical beam receiver. The receiver may take various forms, such as, for example, a photodetector, or coupling optics for coupling the beam into a waveguide, or any other light-responsive or light-conducting devices useful for receiving an optical signal beam. Such an optical switch may also be bi-directional, in that the receiver may operate both as a receiver and as a source of an optical beam from an incoming signal, such as in the case of a receiver in the form of a waveguide plus coupling optics. A large-scale, low-loss optical cross connect may be formed by providing a plurality of such moveable mirrors, each with an optical view of some or all of the others.

MEMS devices are fabricated using materials and processes similar to those employed in integrated circuit fabrication. Such techniques allow simultaneous fabrication of many small mechanical or electromechanical devices on (or in) a single substrate. This simultaneous fabrication capability provides cost advantages for producing mirrors for use in an optical switch of the type described above.

The MEMS mirrors typically suggested for use in such optical switches each include some type of gimbal arrangement and two pairs of hinges. Each pair of hinges provides one degree of freedom of motion, so that both pairs together can provide the desired degree of freedom of motion for a mirror. While mirrors with gimbal arrangements of this type have been fabricated, the fabrication process is sometimes difficult, and the gimbal structure itself is complex and occupies a significant area on the MEMS substrate.

SUMMARY OF THE INVENTION

One aspect of the present invention is a moveable micro-mirror including a supporting structure, a flexible post extending from the supporting structure, and a table extending radially from the end of the post along a plane generally perpendicular to the post, the table having a reflective surface facing away from the supporting structure. The post, desirably formed of single-crystal silicon, is dimensioned to be sufficiently flexible to allow the reflective surface to be selectively moveable and positionable, with at least two degrees of freedom, when urged by a suitable actuating force.

In another aspect, the present invention includes a method of making an array of moveable micromirrors by deep etching a silicon substrate so as to form posts surrounded by trenches, etching back the surface of the substrate around the posts so as to allow the posts to protrude beyond the surface of the substrate, and affixing a table with a reflective surface thereon to the tops of a plurality of the posts. Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE INVENTION

Reference will now be made in detail to the present preferred embodiments of the invention, examples of which are illustrated in the accompanying drawings. Wherever possible, the same reference numbers will be used throughout the drawings to refer to the same or like parts.

Figure 1:
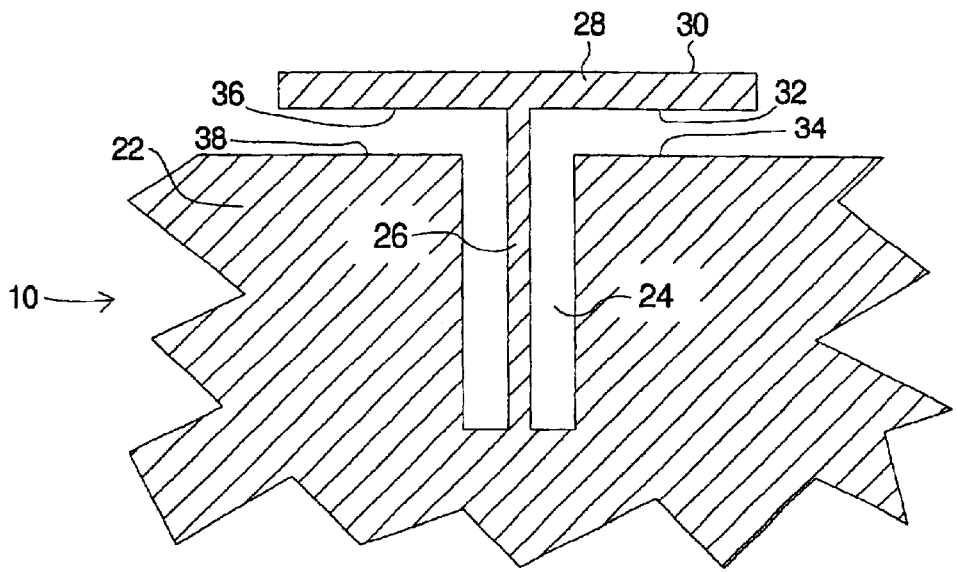
FIG. 1 is a cross-sectional view of an embodiment of one embodiment of a mirror according to the present invention.

An example embodiment of a mirror according to the present invention is shown in FIG. 1, and is designated by reference numeral 10. The mirror 10 includes a platform or table 28 with a reflective surface 30 thereon. The table 28 is supported, on the side of the table 28 opposite the reflective surface 30, by a pillar or post 26, desirable centrally positioned relative to the area of the table 28. The post 26 extends within a moat or trench 24 formed in a surrounding supporting material or substrate 22. This allows the surface of the substrate 22 (at positions 34 and 38) to be positioned closer to the adjacent surface (at positions 32 and 36) of the table 28 than the length of the post 26. Thus the post can be made sufficiently long and sufficiently flexible to act as a unidirectional hinge, bending to allow the table 28 to be positioned with two degrees of freedom, while the adjacent surfaces 32, 34 and 36, 38 can be close enough to allow for electrostatic or other control of the position of the table 28, as will be shown below.

Although the structure is represented in FIG. 1 as unitary, it will be appreciated by those of ordinary skill in the art of MEMS and other micro-fabrication technologies, that the structure of FIG. 1 need not be unitary. Surfaces 34 and 36 may reside on built-up structures, for instance, and table 28 and post 26, for ease of fabrication, need not be of the same unitary structure with supporting material or substrate 22. Because of silicon's advantageous mechanical properties and because of the established micro-fabrication technologies in silicon, it is desirable to use single crystal silicon (doped or not) to form the structures of the mirror, but other appropriate materials may be substituted.

Figure 2:
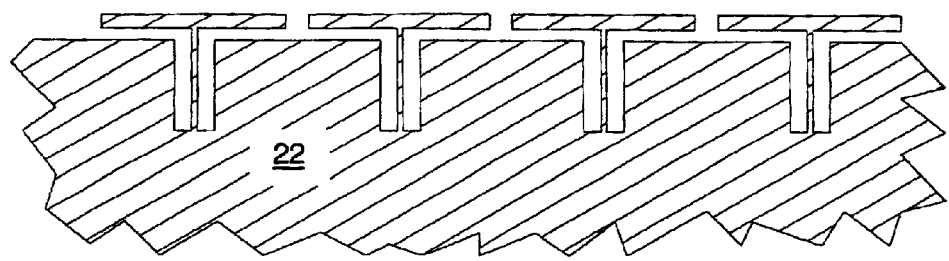
FIG. 2 is a cross-sectional view of a substrate having multiple mirrors positioned thereon.

As mentioned above, the mirror design of the present invention allows for a long, more flexible hinge in the form of the post 26, while allowing for close positioning of adjacent surfaces 32, 34 and 36, 38 to facilitate positioning of the mirror. Another advantage inherent in the design of the present invention is that the hinge in the form of the post does not reside in the plane of the table 28 or reflective surface 30. This allows for dense packing of the mirrors on a given supporting material or substrate 22, as shown in FIG. 2.

Figure 3:
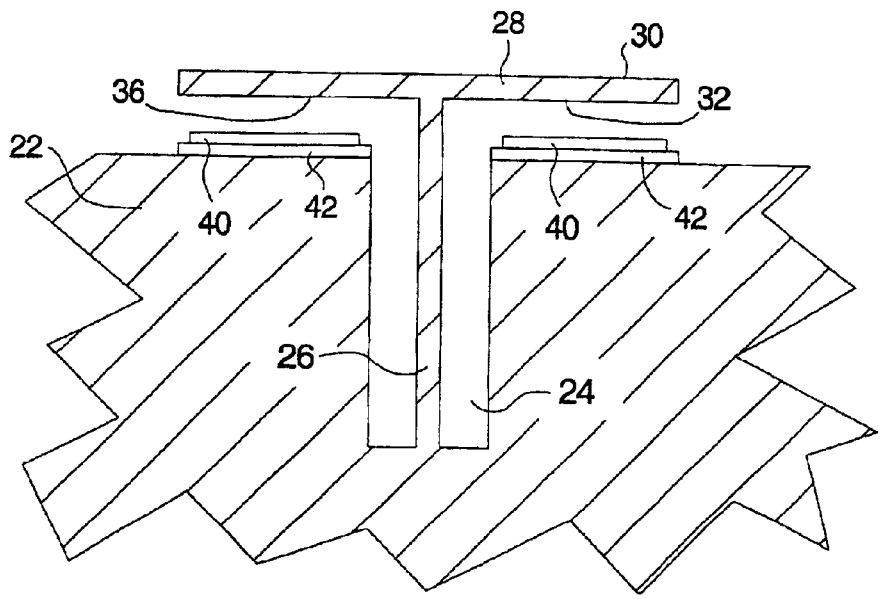
FIG. 3 is a cross-sectional view of one variation of the embodiment of FIG. 1.

Electrostatic actuation is a presently preferred method of controlling the position of the mirror of the present invention. The post 26 and the table 28, as well as the substrate 22, may be formed of a conductive material. Conductive areas or conductive pads 40 may be positioned on insulating layers 42, as shown in FIG. 3. The pads 40 form parallel capacitor plates with the respective surfaces 32 and 36 of the table 28. By biasing one of the conductive pads 40, an opposite charge is induced on the adjacent surface of the table 28, causing the surface to be electrostatically attracted to the pad. The post 26 resists this attraction, allowing the mirror to be controllably positioned within a certain range.

Figure 4:
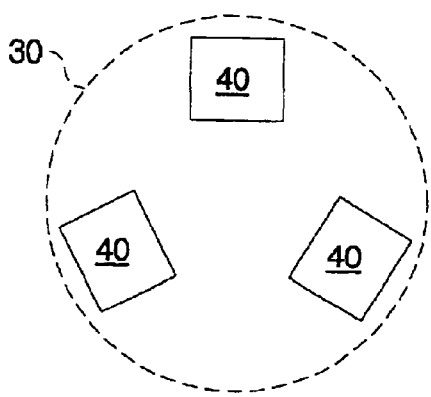
FIG. 4 is a plan view showing an example of the relative positioning of the reflective surface 30 and the conducting areas 40.
Figure 5:
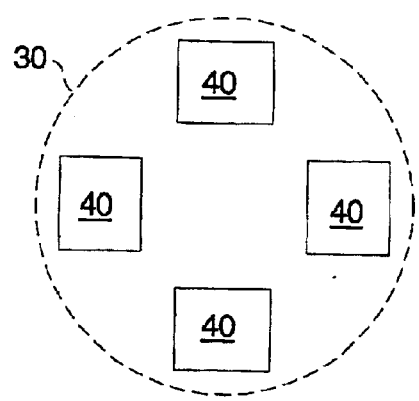
FIG. 5 is a plan view showing another example of the relative positioning of the reflective surface 30 and the conducting areas 40.

Multiple conductive pads 40 are positioned beneath the table 28. FIG. 4 shows a plan view of a layout of three conductive pads 40 relative to the position of the reflective surface 30. FIG. 4 shows a plan view of a layout of four conductive pads 40.

Figure 6:
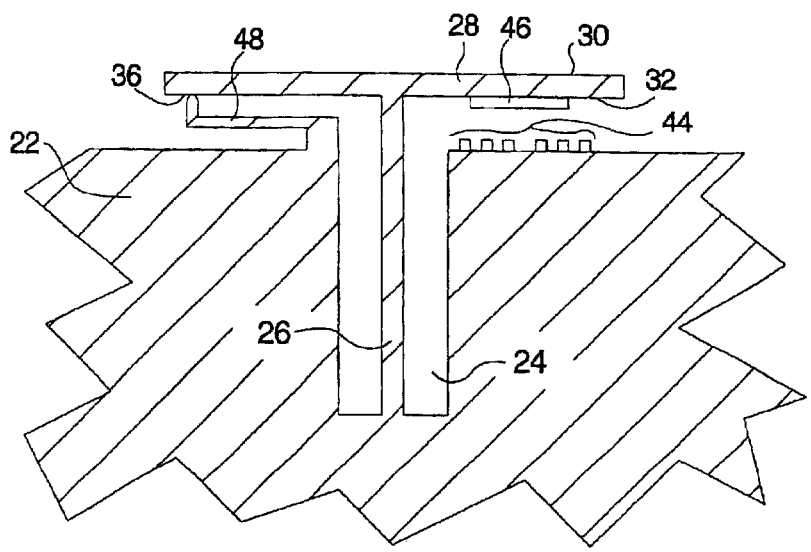
FIG. 6 is a cross-sectional view of the embodiment of FIG. 1 showing two additional variations of that embodiment.

In addition to electrostatic control, other control systems may be employed to move and position the mirror of the present invention. FIG. 6 shows two examples. On the left of FIG. 6, a control arm 48 contacts the surface 36 of the table 28. The control arm may be actuated to push against the surface 36 by piezoelectric, thermal, or other suitable means known to those of ordinary skill in the art. On the right of FIG. 6, a magnetic layer 46 is positioned on the table 28, and a coil 44 is formed on the adjacent surface of the substrate 22 as a means of magnetically controlling the position of the mirror.

Figure 7:
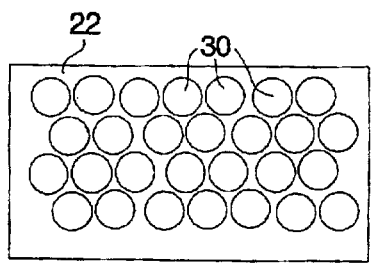
FIG. 7 is a plan view showing an example of the positions of reflective surfaces 30 on a substrate or supporting surface 22.
Figure 8:
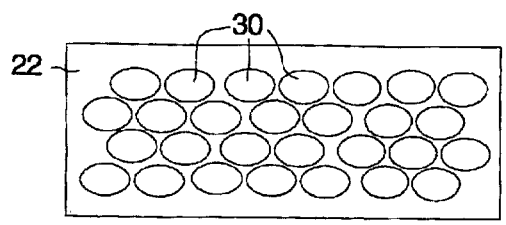
FIG. 8 is a plan view showing another example of the positions of reflective surfaces 30 on a substrate or supporting surface 22.
Figure 9:
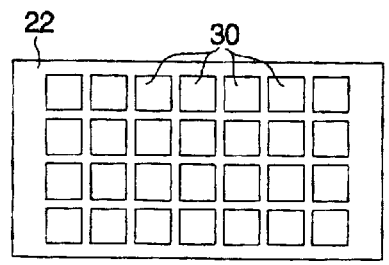
FIG. 9 is a plan view showing yet another example of the positions of reflective surfaces 30 on a substrate or supporting surface 22.
Figure 10:
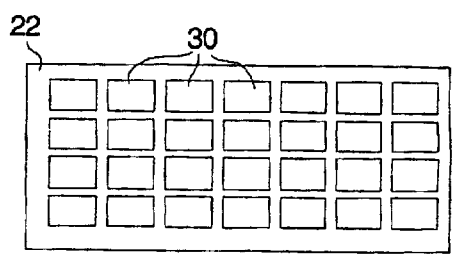
FIG. 10 is a plan view showing still another example of the positions of reflective surfaces 30 on a substrate or supporting surface 22.

Multiple reflective surfaces 30 of mirrors of the present invention may be arranged on a single substrate as shown in FIG. 2 described above. A two-dimensional array of reflective surfaces 30 may also be provided. Various combinations of array patterns and reflective-surface shapes are possible. One embodiment employs circular reflective surfaces arranged in a hexagonal pattern, as show in FIG. 7. The reflective surfaces may also be hexagonal, if desired. Depending on the particular use of the mirrors, elongated reflective surfaces may be desirable. For example, if the mirrors are employed to steer optical beams that arrive at the reflective surface at significant angle to the normal, the beam cross-section at the mirror is typically elongated. Elongated reflective surfaces 30, arranged as shown in FIG. 8, are useful in this case. Square or rectangular reflective surfaces may also be used, as shown for example in FIGS. 9 and 10.

Example Method of Fabrication

The effects of an example method of fabrication of the mirror(s) of the present invention are represented in FIGS. 11 through 23.

Figure 11:
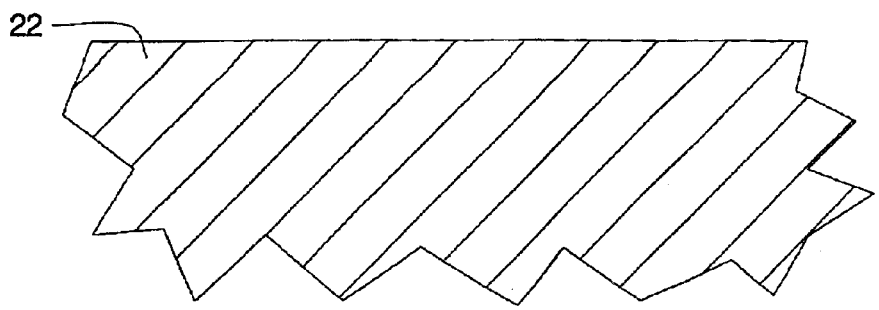
FIG. 11 is a cross-sectional view of a portion of a substrate or supporting material 22 from which an example embodiment of a mirror of the present invention may in part be formed.

FIG. 11 shows a cross section of a portion of a substrate 22 before processing. The substrate 22 is desirably single crystal silicon.

Figure 12:
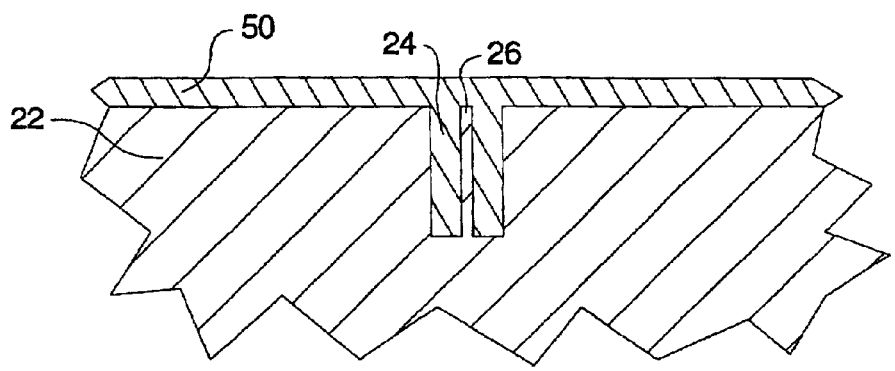
FIG. 12 is a cross-sectional view of the material of FIG. 11 after deep etching and oxidation.

FIG. 12 shows the cross section of FIG. 11 after a deep etch step and an oxidation step. A deep etch such as a deep RIE (reactive ion etch) is used to form the moat or trench 24, thereby also defining the post 26. An oxidation step such as a CVD (chemical vapor deposition) oxidation process is used to conformally cover the surface of the substrate and the moat or trench 24 and the post 26 with a layer of oxide 50.

Figure 13:
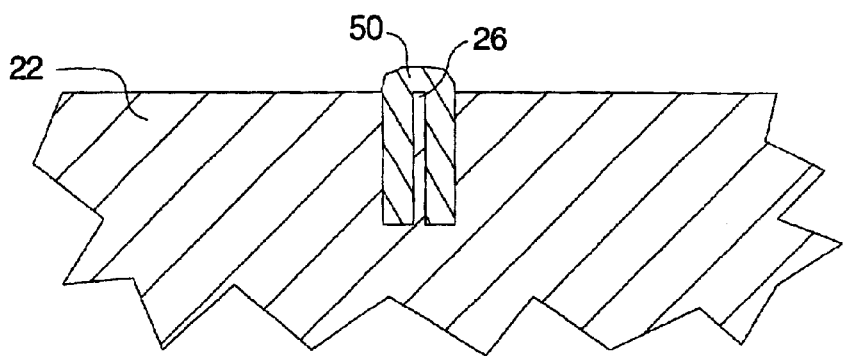
FIG. 13 is a cross-sectional view of the material of FIG. 12 after masking and oxide removal.

FIG. 13 shows the cross section of FIG. 12 after a masking step and an etching step. The etching step etches the oxide 50 back to the substrate 22. The mask is used to shield the oxide in the area above the post 26 and the moat or trench 24.

Figure 14:
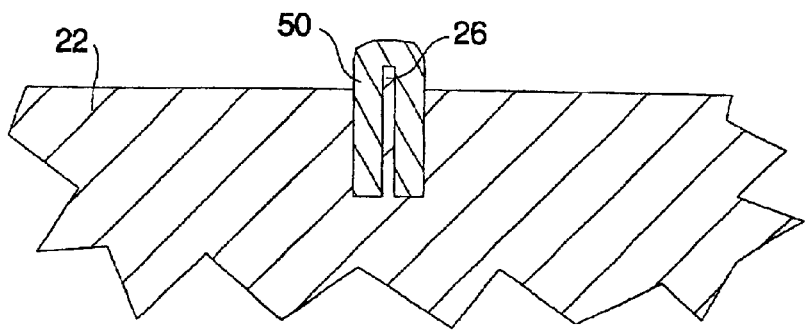
FIG. 14 is a cross-sectional view of the material of FIG. 13 after an etch of the substrate or supporting material 22.

FIG. 14 shows the cross section of FIG. 13 after a step of etching of the substrate 22, such as by a potassium hydroxide etch of a silicon substrate. The oxide 50 protects the post 26. The etching of the substrate 22 leaves the post extending above the surface of the substrate.

Figure 15:
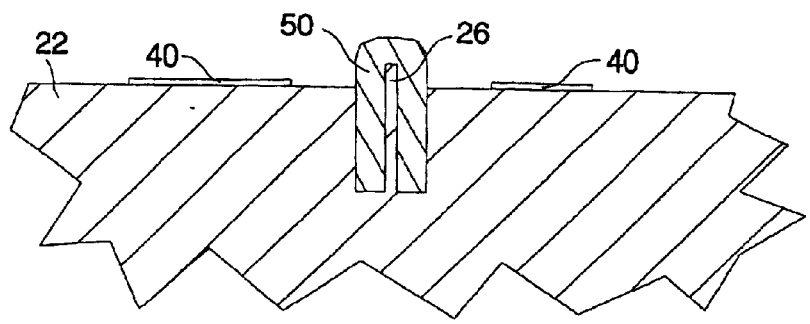
FIG. 15 is a cross-sectional view of the material of FIG. 14 after deposition of conducting pads 40.

FIG. 15 shows the cross section of FIG. 14 after a metal deposition step. The metal deposition step may take the form of PVD (physical vapor deposition or sputtering) through a shadow mask to form conductive pads 40 on the surface of the substrate 22.

Figure 16:
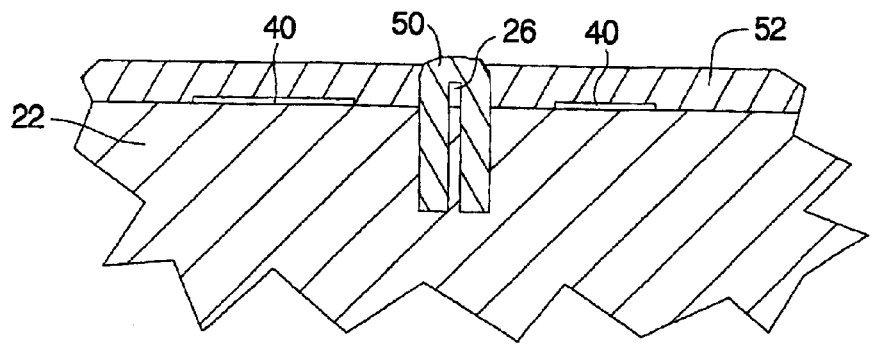
FIG. 16 is a cross-sectional view of the material of FIG. 15 after spin-on of photoresist 52.

FIG. 16 shows the cross section of FIG. 15 after a step of depositing a layer of resist 52, such as by a spin-on process followed by development of the resist 52. The developed layer of resist 52 leaves a portion of the surface of the oxide 50 exposed.

Figure 17:
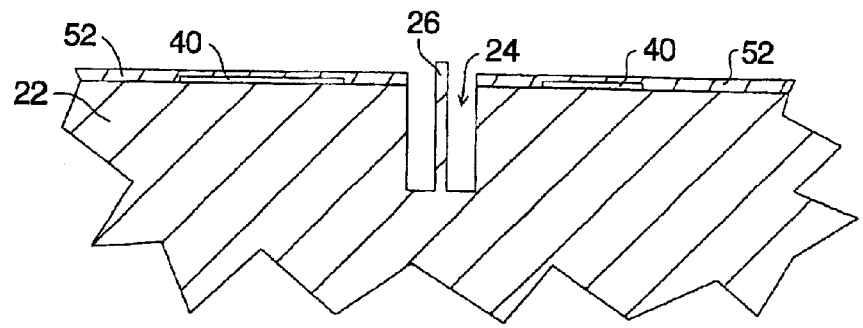
FIG. 17 is a cross-sectional view of the material of FIG. 16 after removal of the oxide 50 and thinning of the photoresist 52.

FIG. 17 shows the cross section of FIG. 16 after a step of HF (hydrofluoric acid) etching and resist etching or ashing. The HF etch removes the oxide 50. The resist etching or ashing thins the layer of resist 52 such that the top of the post 26 extends above the surface of the resist 52.

Figure 18:
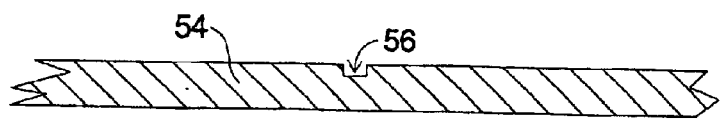
FIG. 18 is a cross-sectional view of a thin material such as a 200-micron silicon wafer after formation of a slot 56 therein.

FIG. 18 shows a cross section of a portion of a thin material, desirably a 200-micron silicon wafer, with a slot etched therein by an etching step.

Figure 19:
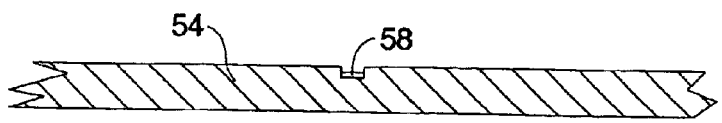
FIG. 19 is a cross-sectional view of the material of FIG. 18 after deposition of a layer 58 of a eutectic bonding agent or an adhesive in the slot 56.

FIG. 19 shows the cross section of FIG. 18 after a step of placing a bonding agent 58 in the slot 56. The boding agent may be an adhesive, such as an epoxy, or a eutectic bonding agent such as a gold layer formed by coating and plating the 200 micron wafer. Alternatively or in addition, a bonding agent 60 may be placed on the top of the post 26 as shown in FIG. 20.

Figure 20:
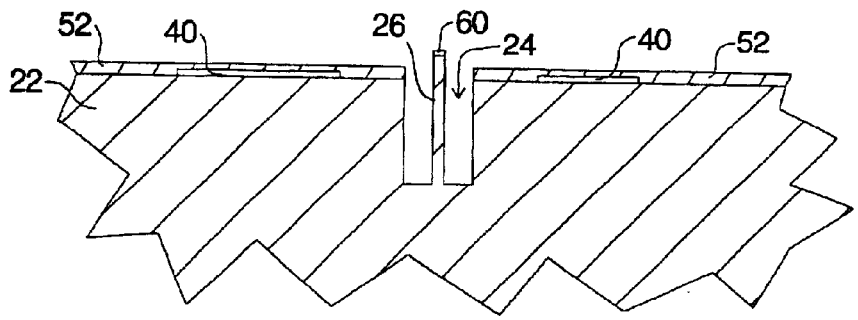
FIG. 20 is a cross-sectional view of the material of FIG. 17 showing a layer 60 of a eutectic bonding agent or an adhesive on top of the post 26.
Figure 21:
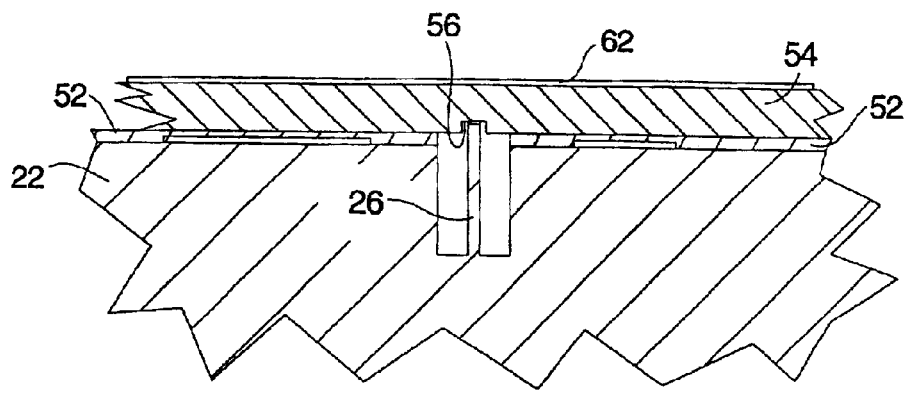
FIG. 21 is a cross-sectional view of the material of FIG. 17 or FIG. 20 with the thin material of FIG. 18 aligned thereto and positioned thereon such that the top of the post 26 is positioned and fixed within the slot 56.

FIG. 21 shows the cross section of the structure of FIG. 17 or 20 after alignment, bonding, and reflective coating deposition steps. The 200-micron wafer 54 is aligned with the slot 56 facing the top of the post 26 and positioned against the top of the post 26 and against the surface of the resist 52. The 200-micron wafer is then bonded to the post 26 by use of the bonding agent with localized heating if necessary. The surface of the 200-micron wafer opposite the slot 56 is then coated with a reflective layer 62 such as a thin layer of sputtered gold to form a reflective surface.

Figure 22:
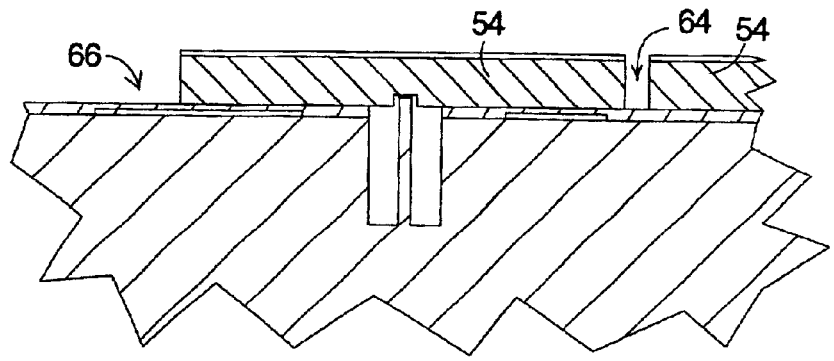

FIG. 22 shows the cross section of FIG. 21 after a masking step and a deep etch step. The mask is formed so as to cover the area of the 200-micron wafer 54 used to form the table of the mirror(s). The exposed areas are deep-etched, such as by deep reactive ion etching, to form trenches such as trench 64 to separate individual mirror tables from each other. Edges of the 200-micron wafer 54 may also be removed as at location 66 to allow for access to the surface of conductive pads 40 for wirebonding.

Figure 23:
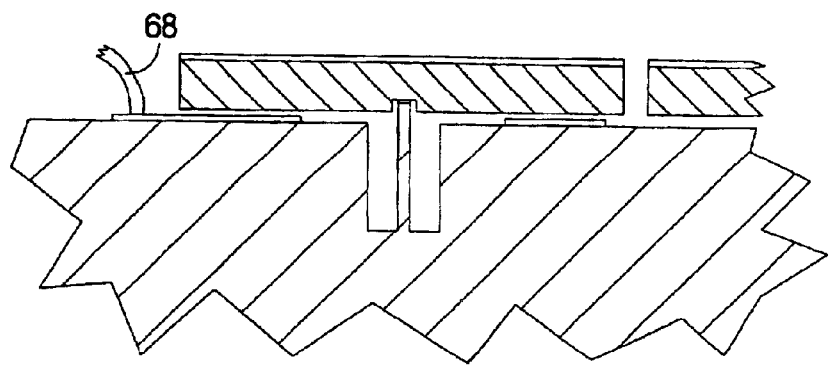
FIG. 23 is a cross-sectional view of the material of FIG. 22 after removal of the photoresist 52 and after wirebonding.

FIG. 23 shows the cross section of FIG. 22 after a photoresist removal step and a wirebonding step. The photoresist is removed thus freeing the moveable portions of the mirror structure. Wirebonding is then used to connect to the conductive pads 40 via locations at the edges of the substrate, as illustrated by wire 68.

Figure 24:
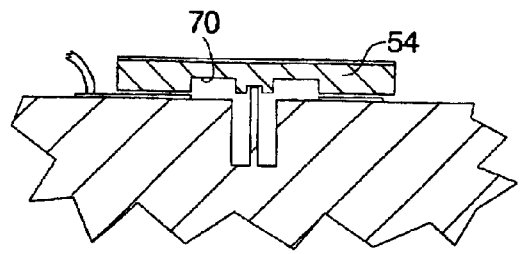
FIG. 24 is a cross-sectional view of another embodiment of the mirror of the present invention.
Figure 25:
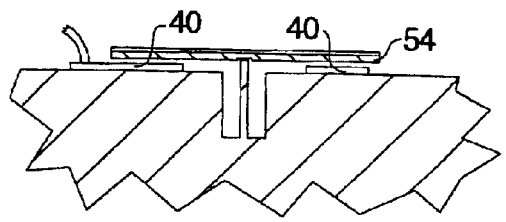
FIG. 25 is across-sectional view of yet another embodiment of the minor of the present invention.

As will be appreciated by those of ordinary skill in the art, the mirror of the present invention and the method of making the mirror may take various forms. One variation is shown in FIG. 24. FIG. 24 is a cross section of an example embodiment of a mirror according to the present invention. In this embodiment, the 200-micron wafer 54 that forms the table of the mirror structure includes recesses 70 in the side opposite the reflective surface. The recesses reduce the mass and inertial mass of the table of the mirror structure. The mass of the table may also be reduced by thinning the 200-micron wafer 54, to result in the mirror shown in the cross section of FIG. 25. The conductive pads 40 may also be raised or thickened if desired to achieve a desired minimum distance between the conductive pads 40 and the adjacent surface of the wafer 54. These and many other modifications will be apparent to those of ordinary skill.

Analysis of an Example Embodiment

Possible dimensions of mirrors according to the present invention are as follows: post length (height) 1 of 200 $\mu$m, post width or diameter, 2 $\mu$m diameter of reflective surface and table, 700 $\mu$m, conductive pad length L (radial dimension out from post) 150 $\mu$m, conductive pad width W 575 $\mu$m±75, and height H of the post extending above conductive pad surface 75 $\mu$m±25.

Figure 26:
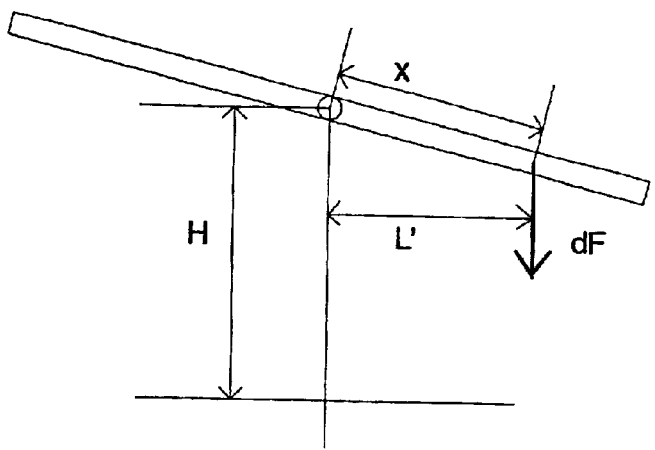
FIG. 26 is a diagram showing reference dimensions and a reference force vector useful for analysis of the forces on the mirror of the present invention.

FIG. 26 illustrates the parameters useful in an analysis of the post and table mirror structure of the present invention. An electrostatic actuator is assumed and the table is assumed to articulate about its center as an approximation. H represents the height of the table above the conductive pad surface. dF represents the differential force acting at a point a distance x along the table length (measured from the center). L represents the length of the conductive pad under the table extending axially out from the central post. One side of the table is taken as closer to the conductive pads than the other.

The torque $T_1$ on the table produced by the charge on the close pad (corresponding to the right side of FIG. 26) is then given by:

$$T_1 = \int L' dF = \int \frac{\varepsilon V_1^2 x (\cos\theta)^2 W}{2(H - x\sin\theta)^2} dx \tag{1}$$

where $\theta$ is the angle with horizontal made by the tilt of the table, V is the potential difference across the conductive pad and table gap, and W is the width of the pad. The torque produced by the distant pad (corresponding to the left side of FIG. 26) is given by:

$$T_2 = \int L' dF = \int \frac{\varepsilon V_2^2 x (\cos\theta)^2 W}{2(H + x\sin\theta)^2} dx \tag{2}$$

The compliance c of the post satisfies the following relation:

$$\frac{\theta}{c} = T \tag{3}$$

where T is the total torque on the table and post assembly. Assuming $T=T_1$, then $$V = \tan\theta \sqrt{\frac{2\theta}{c\varepsilon W \left[ \ln\left(1 - \frac{L}{H}\sin\theta\right) + \frac{1}{1 - \frac{L}{H}\sin\theta} - 1 \right]}} \tag{4}$$

The compliance of the post can be estimated as $$c = \frac{\theta}{3lEI\tan\theta} \quad (5)$$

where l is the length of the post, E is Young's modulus, and I is the moment of inertia of the post cross section, given by $$I = \frac{w^4}{12} \quad (6)$$

where w is the width of the post, assumed to have a square cross section.

Balancing the electrostatic torque with the spring torque of the post structure, mirror rotation angle vs. actuation voltage can be determined. With a ratio of H/L of 0.33 and taking E of silicon of 130 Gpa, w of 2 μm, the following results were calculated: with total length of the post l of 209 μm, c is 400 μm/N and the maximum stable rotation angle approaches 8 degrees at about 120V actuation voltage; with l of 130 μm, c is 250 μm/N and the maximum stable rotation angle approaches 8 degrees at 150V; and with l of 104 μm c is 200 μm/N and the maximum stable rotation angle approaches 8 degrees at 170V. Thus a reasonable range of motion (up to ±8 degrees) is available. The excellent mechanical properties of single-crystal silicon also allow the post structure to withstand buckling forces and static stress.

The present invention thus provides a mirror structure, and a suitable fabrication method for the structure, that provides reasonable range of motion in two degrees of freedom with only one hinge structure in the form of the central post beneath the mirror. Because a significant portion of the total length of the post is recessed into the supporting structure or substrate, the table of the mirror is close enough to the surface of the supporting structure or substrate to allow formation of control structures thereon, while still preserving sufficient post length to provide desired flexibility. With the hinge structure in the form of the post completely hidden behind the table of the mirror, multiple mirrors may be formed in closely packed arrays. The mirror (s) of the present invention may be formed by the process of the present invention, a process generally simpler than other processes for producing mirrors with more than one degree of freedom. As may be seen from the foregoing, all these advantages and others are provided by the present inventive device and method.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A moveable micromirror comprising:
   a supporting structure;
   a flexible post extending from within a trench in the supporting structure such that more than one half of the length of the post is within the trench; and
   a table extending radially from the end of the post along a plane generally perpendicular to the post, the table having a reflective surface facing away from the supporting structure,
   wherein the post is so constructed so as to be sufficiently flexible to allow the reflective surface to be selectively moveable and positionable, with at least two degrees of freedom, when urged by a suitable actuating force.

2. The moveable micromirror of claim 1 wherein the flexible post extends from the supporting structure from within a trench in the supporting structure such that more than one half of the length of the post is within the trench.

3. The movable micromirror of claim 1 wherein at least three-quarters of the length of the post is within the trench.

4. The moveable micromirror of claim 1 wherein the supporting structure and the post are formed of a single crystal of silicon.

5. The moveable micromirror of claim 1 further comprising conductive pads positioned on a surface of the supporting structure facing the table, and wherein the table includes a conductive material.

6. The moveable micromirror of claim 5 wherein the average distance from the surfaces of the conductive pads to the surface of the table fadng the conductive pads is less than the length of the post.

7. The moveable micromirror of claim 6 wherein the average distance from the surfaces of the conductive pads to the surface of the table facing the conductive pads is less than one-half the length of the post.

8. The moveable micromirror of claim 7 wherein the average distance from the surfaces of the conductive pads to the surface of the table facing the conductive pads is less than one-third the length of the post.

9. The moveable micromirror of claim 1 further comprising an electrostatic actuator structured and arranged so as to be able to selectively position the reflective surface.

10. The moveable micromirror of claim 1 further comprising an electromagnetic actuator structured and arranged so as to be able to selectively position the reflective surface.

11. The moveable micromirror of claim 1 further comprising a piezoelectric actuator structured and arranged so as to be able to selectively position the reflective surface.

12. The moveable micromirror of claim 1 further comprising a thermal actuator structured and arranged so as to be able to selectively position the reflective surface.

13. An array of moveable micromirrors comprising two or more micromirrors as recited in claim 1.

14. A moveable micromirror for selectively directing optical beams, the micromirror comprising:
   a substrate formed of a first single crystal of silicon;
   a post extending from within a moat in a surface of the substrate, the post being formed of the single crystal of silicon;
   a table fixed along a plane generally perpendicular to and supported by the post and having a reflective surface facing away from the surface of the substrate and a second surface facing the surface of the substrate, the distance from the surface of the substrate to the second surface of the table being less than the length of the post; and
   an actuator positioned on the surface of the substrate adjacent the second surface of the table and structured so as to be able to selectively position the table by applying an actuating force to the table
   wherein the post is sufficiently flexible to allow the reflective surface to be selectively moveable and positionable by the actuator.

15. The moveable mirror of claim 14 wherein the actuator is an electrostatic actuator.

16. An array of micromirrors comprising at least two of the moveable mirrors recited in claim 14.

17. A method of making an array of moveable micromirrors, the method including:
   deep etching a silicon substrate so as to form posts surrounded by trenches;

etching back the surface of the substrate around the posts so as to allow the posts to protrude beyond the surface of the substrate; and affixing a mirror to the top of a plurality of the posts along a plane generally perpendicular to the posts.

18. The method of claim 17 wherein the step of affixing a mirror to the top of a plurality of the posts includes:

bonding a wafer to the tops of the plurality of the posts;

depositing one or more reflective layers on the surface of the wafer opposite the posts; and deep-etching the wafer to separate the wafer into individual mirrors affixed to the top of each post of the plurality of the posts.

19. The method of claim 18 wherein the step of affixing a mirror to the top of a plurality of the posts further includes, before the step of bonding a wafer to the tops of the plurality of the posts, the step of forming a removable layer on the substrate, and wherein the step of bonding a wafer to the tops of the plurality of the posts includes positioning the wafer in contact with the tops of the posts and in contact with the removeable layer.

20. The method of claim 19 wherein the removeable layer is a layer of photoresist.

21. The method of claim 19 wherein the step of bonding a wafer to the tops of the plurality of the posts includes etching notches in the wafer and aligning the notches with the plurality of the posts such that the plurality of the posts are positioned within the notches and are bonded to the wafer in the notches.

22. The method of claim 18 wherein the step of deep etching the wafer to separate the wafer into individual mirrors includes deep reactive ion etching.

23. The method of claim 17 wherein the step of deep etching the silicon substrate includes deep reactive ion etching.

* * * * *